(12) United States Patent
Sakuma et al.

(10) Patent No.: US 9,812,554 B2
(45) Date of Patent: Nov. 7, 2017

(54) METHOD FOR MANUFACTURING A SEMICONDUCTOR DEVICE WITH INCREASED BREAKDOWN VOLTAGE

(71) Applicant: Kabushiki Kaisha Toshiba, Minato-ku, Tokyo (JP)

(72) Inventors: Tomoyuki Sakuma, Nonoichi Ishikawa (JP); Shinya Sato, Nonoichi Ishikawa (JP); Noboru Yokoyama, Kanazawa Ishikawa (JP); Akihiro Shimada, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/000,786

(22) Filed: Jan. 19, 2016

(65) Prior Publication Data

US 2017/0062585 A1   Mar. 2, 2017

(30) Foreign Application Priority Data

Sep. 2, 2015   (JP) .................................. 2015-173209

(51) Int. Cl.
*H01L 29/66* (2006.01)
*H01L 29/06* (2006.01)
*H01L 21/266* (2006.01)
*H01L 21/3065* (2006.01)
*H01L 29/423* (2006.01)

(52) U.S. Cl.
CPC ...... *H01L 29/66666* (2013.01); *H01L 21/266* (2013.01); *H01L 21/3065* (2013.01); *H01L 29/0634* (2013.01); *H01L 29/4236* (2013.01)

(58) Field of Classification Search
CPC ............ H01L 29/66666; H01L 21/266; H01L 21/3065; H01L 29/0634; H01L 29/4236; H01L 29/0611; H01L 29/0661
See application file for complete search history.

(56) References Cited

U.S. PATENT DOCUMENTS

| | | | |
|---|---|---|---|
| 7,276,773 B2 | 10/2007 | Saito et al. | |
| 7,714,385 B2 | 5/2010 | Tokano et al. | |
| 2007/0148931 A1 | 6/2007 | Tokano et al. | |

(Continued)

FOREIGN PATENT DOCUMENTS

JP    2010-225831 A    10/2010

*Primary Examiner* — Scott B Geyer
(74) *Attorney, Agent, or Firm* — White & Case LLP

(57) ABSTRACT

According to one embodiment, a method for manufacturing a semiconductor device comprises making a first opening, ion-implanting an impurity of a second conductivity type, and forming a third semiconductor layer of the second conductivity type. The first opening is made in a second semiconductor layer. The second semiconductor layer is provided on a first semiconductor layer. The first opening extends in a second direction. A dimension in a third direction of an upper part of the first opening is longer than a dimension in the third direction of a lower part of the first opening. The third direction is perpendicular to the first direction and the second direction. The impurity of the second conductivity type is ion-implanted into a side surface of the lower part of the first opening. The third semiconductor layer of the second conductivity type is formed in an interior of the first opening.

8 Claims, 7 Drawing Sheets

(56) References Cited

U.S. PATENT DOCUMENTS

2012/0299091 A1* 11/2012 Tsai .................... H01L 29/7813
   257/334
2016/0071940 A1* 3/2016 Okumura ............ H01L 29/4236
   257/331

* cited by examiner

METHOD FOR MANUFACTURING A SEMICONDUCTOR DEVICE WITH INCREASED BREAKDOWN VOLTAGE

CROSS-REFERENCE TO RELATED APPLICATIONS

This application is based upon and claims the benefit of priority from Japanese Patent Application No. 2015-173209, filed on Sep. 2, 2015; the entire contents of which are incorporated herein by reference.

FIELD

Embodiments described herein relate generally to a method for manufacturing a semiconductor device.

BACKGROUND

There is a semiconductor device that has a super junction structure (hereinbelow, called a SJ structure) in which n-type semiconductor regions and p-type semiconductor regions are provided alternately. The breakdown voltage of the semiconductor device can be increased by providing the SJ structure. In such a case, the breakdown voltage of the semiconductor device can be increased by providing a smaller difference between the n-type impurity amount included in the n-type semiconductor regions and the p-type impurity amount included in the p-type semiconductor regions.

DETAILED DESCRIPTION

Figure 1:
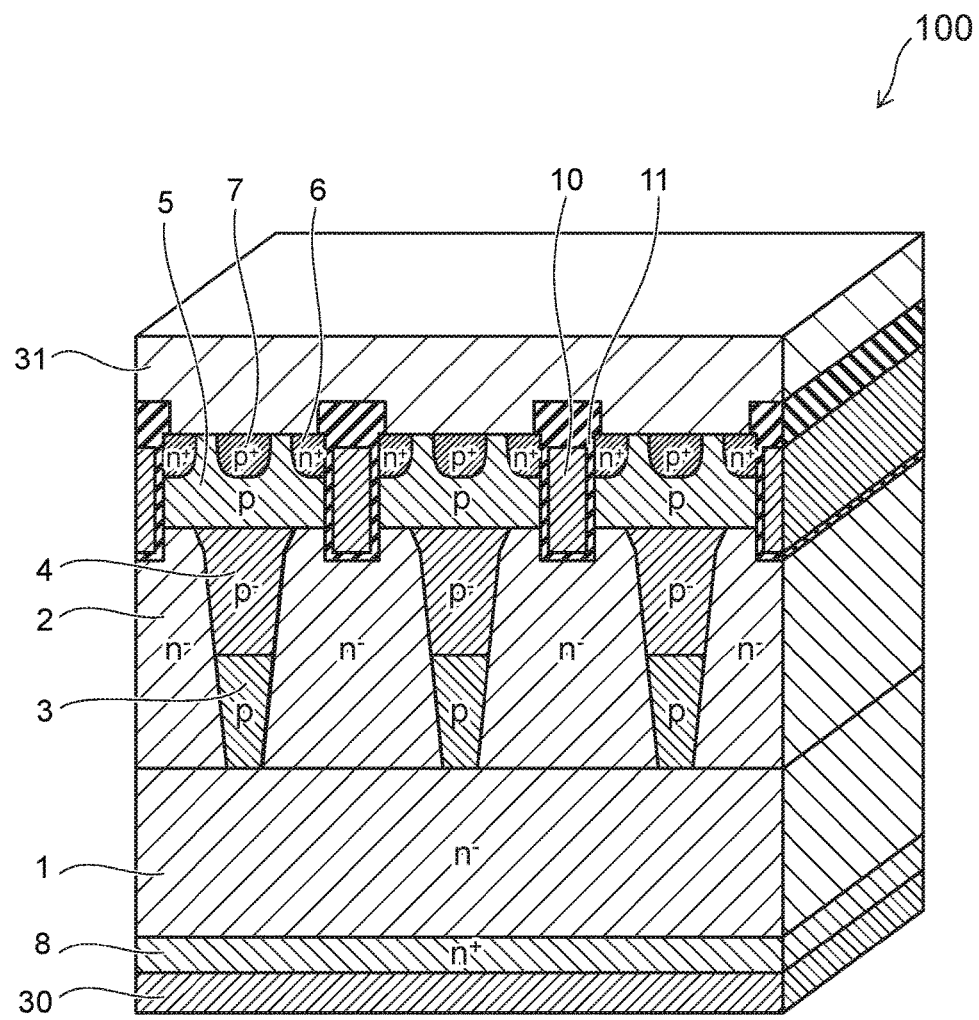
FIG. 1 is a perspective cross-sectional view showing a part of a semiconductor device manufactured using a method for manufacturing a semiconductor device according to a first embodiment.

According to one embodiment, a method for manufacturing a semiconductor device comprises making a first opening, ion-implanting an impurity of a second conductivity type, and forming a third semiconductor layer of the second conductivity type. The first opening is made in a second semiconductor layer of a first conductivity type. The second semiconductor layer is provided on a first semiconductor layer of the first conductivity type. The first opening extends in a second direction. A dimension in a third direction of an upper part of the first opening is longer than a dimension in the third direction of a lower part of the first opening. The second direction is perpendicular to a first direction from the first semiconductor layer toward the second semiconductor layer. The third direction is perpendicular to the first direction and the second direction. The impurity of the second conductivity type is ion-implanted into a side surface of the lower part of the first opening. The third semiconductor layer of the second conductivity type is formed in an interior of the first opening.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments. A direction from an $n^+$-type drain region 8 toward an $n^-$-type semiconductor region 1 is taken as a Z-direction (a first direction); and two mutually-orthogonal directions perpendicular to the Z-direction are taken as an X-direction (a third direction) and a Y-direction (a second direction).

In the following description, the notations of $n^+$, $n^-$, $p^+$, p, and $p^-$ indicate relative levels of the impurity concentrations of the conductivity types. Namely, $n^+$ indicates that the n-type impurity concentration is relatively higher than that of $n^-$. $p^+$ indicates that the p-type impurity concentration is relatively higher than that of p; and $p^-$ indicates that the p-type impurity concentration is relatively lower than that of p.

The embodiments described below may be implemented by reversing the p-type and the n-type of the semiconductor regions.

First Embodiment

FIG. 1 is a perspective cross-sectional view showing a part of a semiconductor device 100 manufactured using a method for manufacturing a semiconductor device according to a first embodiment.

The semiconductor device 100 is, for example, a MOSFET.

As shown in FIG. 1, the semiconductor device 100 includes the $n^+$-type (a first conductivity type) drain region 8, the $n^-$-type semiconductor region 1, an $n^-$-type semiconductor region 2, a p-type (a second conductivity type) semiconductor region 3, a $p^-$-type semiconductor region 4, a p-type base region 5, an $n^+$-type source region 6, a $p^+$-type contact region 7, a gate electrode 10, a gate insulating layer 11, a drain electrode 30, and a source electrode 31.

The drain electrode 30 is provided at the lower surface of the semiconductor device 100.

The $n^+$-type drain region 8 is provided on the drain electrode 30 and is electrically connected to the drain electrode 30.

The $n^-$-type semiconductor region 1 is provided on the $n^+$-type drain region 8.

The $n^-$-type semiconductor region 2 is provided on a part of the $n^-$-type semiconductor region 1.

The p-type semiconductor region 3 is provided on another part of the $n^-$-type semiconductor region 1.

The $p^-$-type semiconductor region 4 is provided on the p-type semiconductor region 3. The length in the X-direction of the $p^-$-type semiconductor region 4 is longer than the length in the X-direction of the p-type semiconductor region 3.

The n⁻-type semiconductor region 2, the p-type semiconductor region 3, and the p⁻-type semiconductor region 4 extend in the Y-direction. The n⁻-type semiconductor region 2 is multiply provided in the X-direction. The p-type semiconductor region 3 and the p⁻-type semiconductor region 4 are provided between the n⁻-type semiconductor regions 2.

The SJ structure is formed by providing the n⁻-type semiconductor region 2, the p-type semiconductor region 3, and the p⁻-type semiconductor region 4 alternately in the X-direction.

The n⁻-type semiconductor region 1 and the n⁻-type semiconductor region 2 may be regions provided inside one semiconductor layer or may be regions provided inside mutually-different semiconductor layers. Also, the n-type impurity concentration of the n⁻-type semiconductor region 1 may be different from the n-type impurity concentration of the n⁻-type semiconductor region 2.

The p-type base region 5 is provided on the n⁻-type semiconductor region 2 and the p⁻-type semiconductor region 4. The n⁺-type source region 6 and the p⁺-type contact region 7 are selectively provided on the p-type base region 5.

The gate electrode 10 is arranged with the p-type base region 5 in the X-direction. The gate insulating layer 11 is provided between the gate electrode 10 and the n⁻-type semiconductor region 2, between the gate electrode 10 and the p-type base region 5, and between the gate electrode 10 and the n⁺-type source region 6.

The p-type base region 5, the n⁺-type source region 6, the p⁺-type contact region 7, and the gate electrode 10 are multiply provided in the X-direction; and each extends in the Y-direction.

The source electrode 31 is provided at the upper surface of the semiconductor device 100 and is positioned on the n⁺-type source region 6 and the p⁺-type contact region 7. The source electrode 31 is electrically connected to the n⁺-type source region 6 and the p⁺-type contact region 7. The gate insulating layer 11 is also provided between the source electrode 31 and the gate electrode 10; and these electrodes are electrically isolated.

The MOSFET is switched to the ON state by applying a voltage that is not less than the threshold to the gate electrode 10 in a state in which a voltage that is positive with respect to the source electrode 31 is applied to the drain electrode 30. At this time, a channel (an inversion layer) is formed in the p-type base region 5 at the gate insulating layer 11 vicinity. Electrons that are injected via the n⁺-type source region 6 flow through the n⁻-type semiconductor region 2 and the n⁻-type semiconductor region 1 via the channel and are discharged from the drain electrode 30.

When the MOSFET is in the OFF state and a voltage that is positive with respect to the source electrode 31 is applied to the drain electrode 30, a depletion layer spreads from the p-n junction surface between the n⁻-type semiconductor region 2 and the p-type semiconductor region 3 and the p-n junction surface between the n⁻-type semiconductor region 2 and the p⁻-type semiconductor region 4 toward each of the semiconductor regions. The breakdown voltage of the semiconductor device can be increased by this depletion layer spreading from the p-n junction surfaces.

The method for manufacturing the semiconductor device according to the first embodiment will now be described using FIG. 2A to FIG. 4B.

FIG. 2A to FIG. 4B are cross-sectional views of processes, showing the method for manufacturing the semiconductor device according to the first embodiment.

Figure 2A:
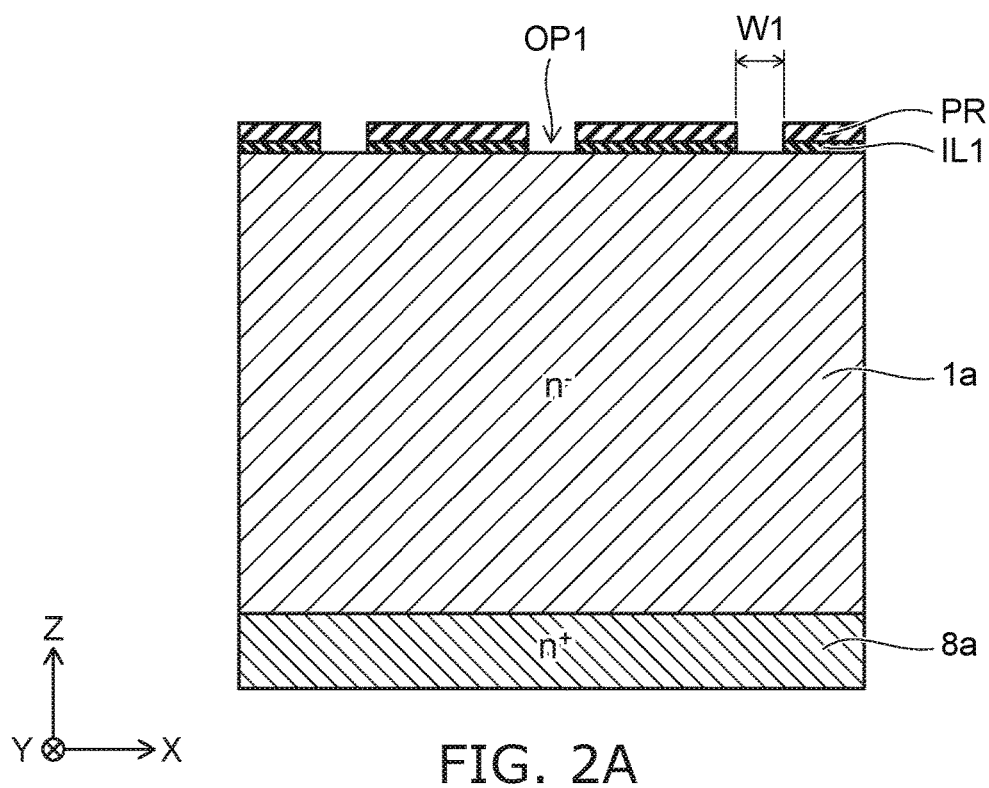
FIG. 2A to FIG. 4B are cross-sectional views of processes, showing the method for manufacturing the semiconductor device according to the first embodiment.

First, an n⁻-type semiconductor layer 1a (a second semiconductor layer) is formed on an n⁺-type semiconductor layer 8a (a first semiconductor layer). Then, an insulating layer IL1 is formed on the n⁻-type semiconductor layer 1a. Continuing, a photoresist layer PR is formed and patterned on the insulating layer IL1. An opening OP1 (a second opening) is made in the insulating layer IL1 as shown in FIG. 2A by RIE (Reactive Ion Etching) using the patterned photoresist layer PR as a mask. The opening OP1 extends in the Y-direction. A width W1 (the dimension in the X-direction) of the opening OP1 is shorter than the distance between the openings OP1.

Figure 2B:
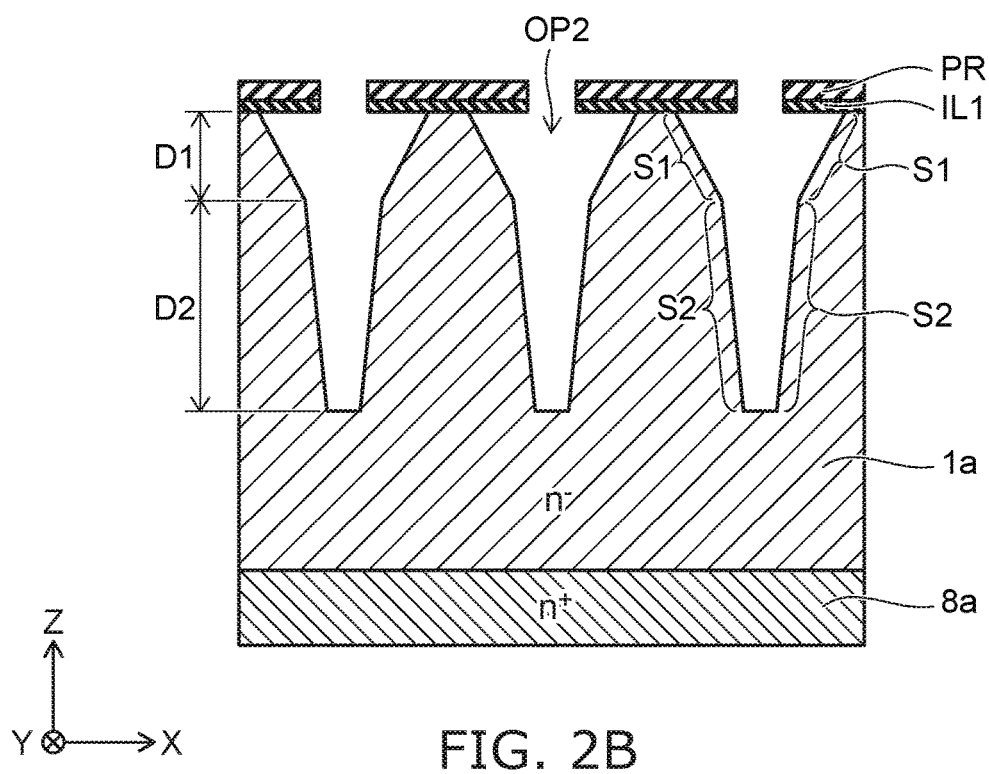

Then, an opening OP2 (a first opening) is made in the n⁻-type semiconductor layer 1a as shown in FIG. 2B using the photoresist layer PR and the insulating layer IL1 as a mask.

The opening OP2 extends in the Y-direction. The width (the dimension in the X-direction) of the lower part of the opening OP2 is narrower than the width W1. The width of the upper part of the opening OP2 is wider than the width W1. The opening OP2 has a first side surface S1 and a second side surface S2. The first side surface S1 is positioned higher than the second side surface S2. The tilt of the second side surface S2 with respect to the n⁺-type semiconductor layer 8a is larger than the tilt of the first side surface S1 with respect to the n⁺-type semiconductor layer 8a. In other words, the angle between the second side surface S2 and the X-Y plane is larger than the angle between the first side surface S1 and the X-Y plane. The tilt of the first side surface S1 with respect to the n⁺-type semiconductor layer 8a and the tilt of the second side surface S2 with respect to the n⁺-type semiconductor layer 8a are 45 degrees or more.

For example, the opening OP2 is made in the n⁻-type semiconductor layer 1a by performing anisotropic etching using RIE after performing isotropic etching using CDE (Chemical Dry Etching). At this time, the opening OP2 is made so that at least a part of the width of the portion where the first side surface S1 is formed is wider than the width W1, and at least a part of the width of the portion where the second side surface S2 is formed is narrower than the width W1.

In the example shown in FIG. 2B, the width of the portion where the first side surface S1 is formed is wider than the width W1; and a part of the width of the portion where the second side surface S2 is formed is narrower than the width W1. In the example shown in FIG. 2B, a dimension D1 in the Z-direction of the portion where the first side surface S1 is formed is shorter than a dimension D2 in the Z-direction of the portion where the second side surface S2 is formed.

Then, a p-type impurity is ion-implanted into the n⁻-type semiconductor layer 1a via the opening OP1. At this time, the p-type impurity is ion-implanted mainly in the lower part of the opening OP2 because the width of the upper part of the opening OP2 is wider than the width of the opening OP1. For example, in the case of the structure shown in FIG. 2B, the p-type impurity is ion-implanted into the bottom surface of the opening OP2 and the lower part of the second side surface S2.

Then, the photoresist layer PR is removed; and the opening OP2 is filled by performing epitaxial growth of a p⁻-type semiconductor layer 3a. A p⁻-type semiconductor region 4a is formed in the upper part of the opening OP2 because ion implantation of the lower part of the opening OP2 is performed selectively in the previous process. Conversely, the p-type semiconductor region 3 is formed in the lower part of the opening OP2. At this time, the p-type semiconductor region 3 includes a first portion P1, and a second portion P2 that has a higher p-type impurity concentration than the first portion P1. This is because the ion implantation is performed into the bottom portion and side wall of the opening OP2 in the previous process; and the p-type impurity concentration at the outer side of the p-type semiconductor region 3 is higher than the p-type impurity concentration at the center of the p-type semiconductor region 3.

Figure 3A:
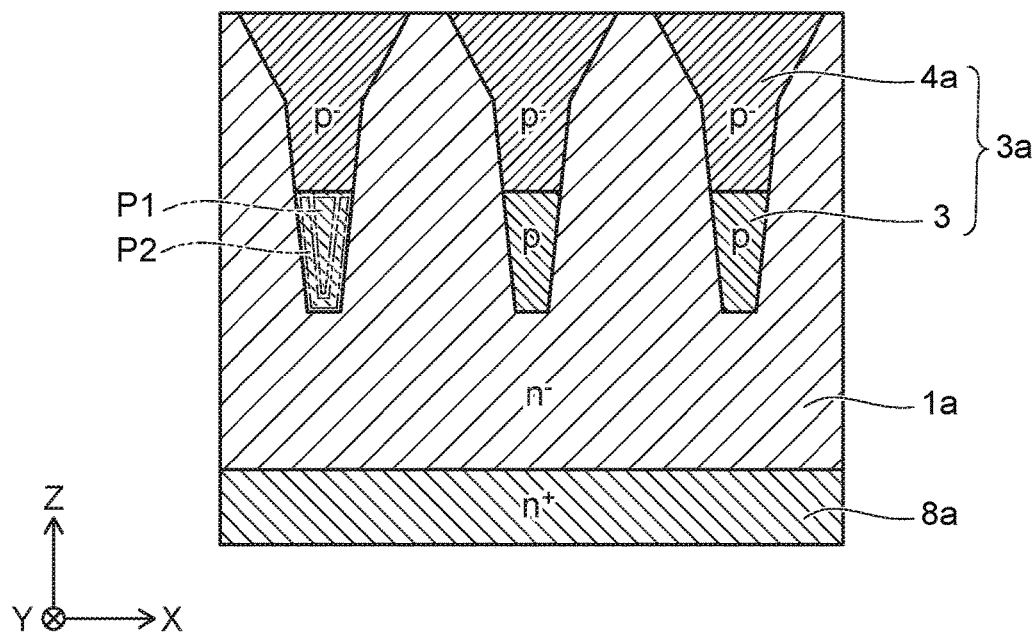

Continuing, the upper surface of the p$^-$-type semiconductor layer 3a is polished by CMP (Chemical Mechanical Polishing) using the insulating layer IL1 as a stopper. Continuing, the insulating layer IL1 is removed; and the upper surface of the p$^-$-type semiconductor layer 3a is planarized by etching the upper surface of the p$^-$-type semiconductor layer 3a. The state at this time is shown in FIG. 3A.

Then, the p-type base region 5 (the first semiconductor region) is formed by ion-implanting a p-type impurity into the front surface of the n$^-$-type semiconductor layer 1a and the front surface of the p$^-$-type semiconductor region 4a and by performing activation. At this time, the region of the p$^-$-type semiconductor region 4a other than the p-type base region 5 corresponds to the p$^-$-type semiconductor region 4 shown in FIG. 1. The part of the n$^-$-type semiconductor layer 1a that is positioned between the p-type semiconductor regions 3 and between the p$^-$-type semiconductor regions 4 corresponds to the n$^-$-type semiconductor region 2 shown in FIG. 1.

Figure 3B:
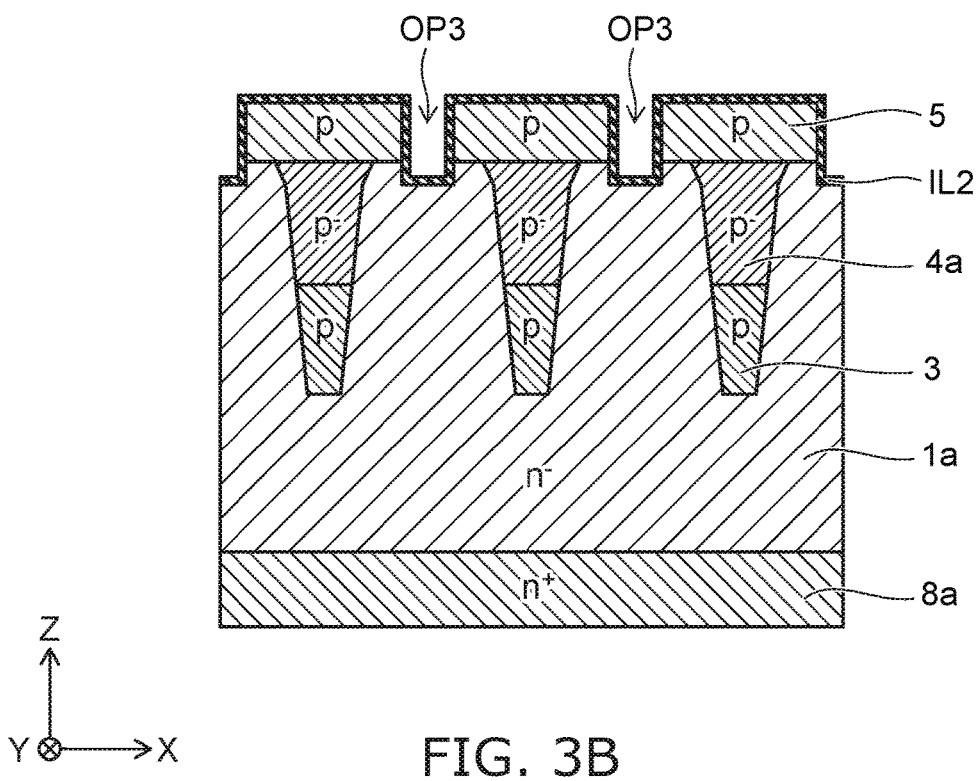

Then, an opening OP3 (a third opening) that pierces the p-type base region 5 and reaches the n$^-$-type semiconductor layer 1a is made. Continuing, an insulating layer IL2 (the first insulating layer) is formed along the inner wall of the opening OP3 and the front surface of the p-type base region 5 as shown in FIG. 3B by thermal oxidation.

Then, a conductive layer that fills the opening OP3 is formed by CVD on the insulating layer IL2. Continuing, the gate electrodes 10 are formed in the interior of each of the openings OP3 by causing the upper surface of the conductive layer to recede by etching.

Then, an n-type impurity is ion-implanted into a part of the front surface of the p-type base region 5. Continuing, the n$^+$-type source region 6 (the second semiconductor region) and the p$^+$-type contact region 7 are formed in another part of the front surface of the p-type base region 5 by ion-implanting a p-type impurity and performing activation. Continuing, an insulating layer IL3 that covers the gate electrode 10 is formed on the insulating layer IL2.

Figure 4A:
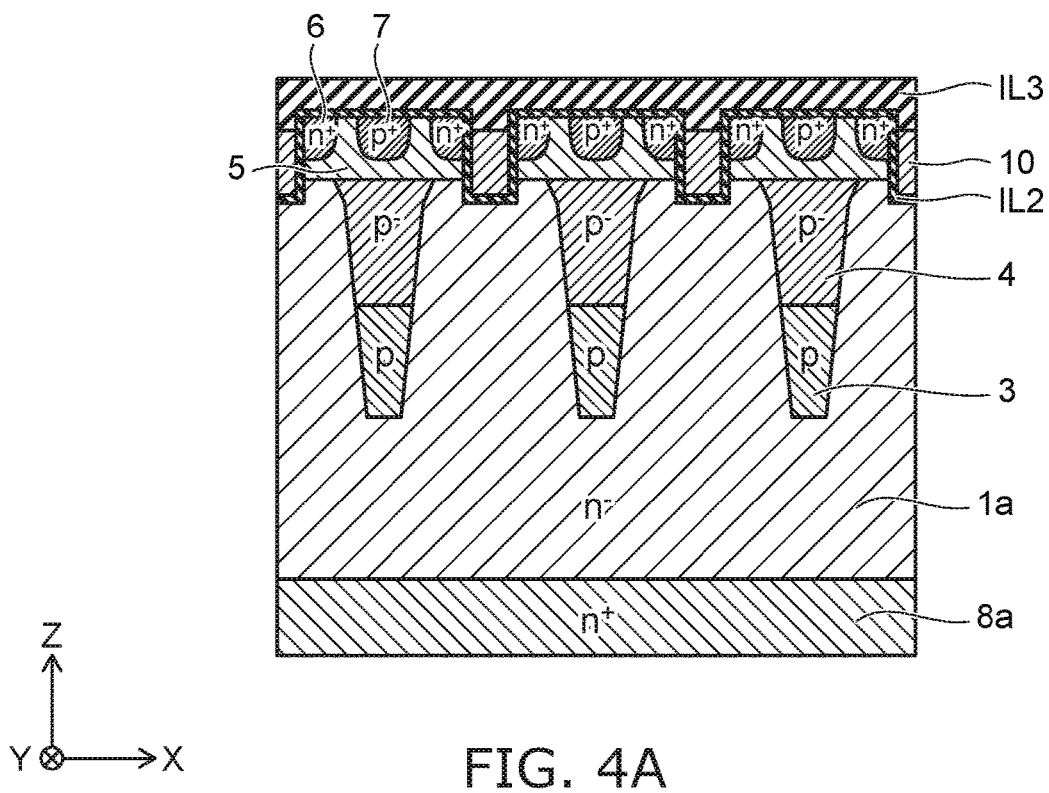
Figure 4B:
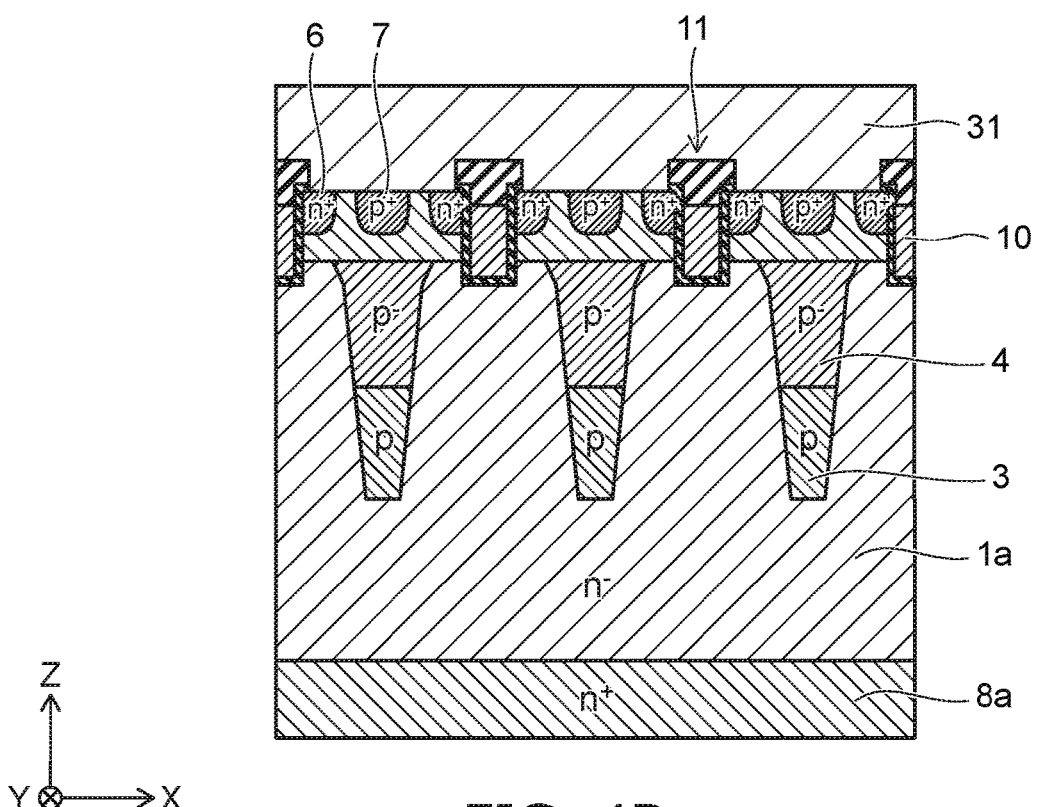

Then, the insulating layers IL2 and IL3 are patterned to expose the n$^+$-type source region 6 and the p$^+$-type contact region 7. The gate insulating layer 11 shown in FIG. 1 is formed by this process. Continuing, a metal layer that covers the gate insulating layer 11 is formed on the n$^+$-type source region 6 and the p$^+$-type contact region 7. The source electrode 31 is formed as shown in FIG. 4B by patterning the metal layer.

Then, the back surface of the n$^+$-type semiconductor layer 8a is polished until the n$^+$-type semiconductor layer 8a has a prescribed thickness. Subsequently, the semiconductor device 100 shown in FIG. 1 is obtained by forming a metal layer on the polished back surface of the n$^+$-type semiconductor layer 8a to form the drain electrode 30.

In the manufacturing method described above, the heat treatment for activating the impurity included in each of the semiconductor regions may be executed each time the ion implantation is performed to form each of the semiconductor regions or may be executed collectively after performing the ion implantation process multiple times. For example, the heat treatment that is performed when forming the p-type semiconductor region 3, the p$^-$-type semiconductor region 4, and the p-type base region 5 may be performed simultaneously with the process of thermal oxidation to form the insulating layer IL2. In other words, the impurities may be activated by the heat treatment when forming the insulating layer IL2.

In the manufacturing method described above, the p-type base region 5 is formed; subsequently, the opening OP3 is made; and subsequently, the n$^+$-type source region 6 and the p$^+$-type contact region 7 are formed. However, this is not limited thereto; the p-type base region 5, the n$^+$-type source region 6, and the p$^+$-type contact region 7 may be formed after making the opening OP3; or the opening OP3 may be made after forming these semiconductor regions. It is also possible to appropriately modify the order of formation of these semiconductor regions.

Examples of the materials of the components of the manufacturing method according to the embodiment will now be described.

The n$^+$-type semiconductor layer 8a, the n$^-$-type semiconductor layer 1a, and the p$^-$-type semiconductor layer 3a include silicon, silicon carbide, gallium nitride, or gallium arsenide as a semiconductor material.

Arsenic, phosphorus, or antimony may be used as an n-type impurity.

Boron may be used as a p-type impurity.

The insulating layers IL1 to IL3 include an insulating material such as silicon oxide, etc.

The conductive layer that is filled into the interior of the opening OP3 includes a conductive material such as polycrystalline silicon, etc.

The metal layer for forming the drain electrode 30 and the source electrode 31 includes a metal material such as aluminum, etc.

Effects of the manufacturing method according to the embodiment will now be described.

As described above, the breakdown voltage of the semiconductor device can be increased by providing the SJ structure. The breakdown voltage can be increased by providing a smaller difference between the impurity amounts of the n-type semiconductor region and the p-type semiconductor region included in the SJ structure.

The SJ structure can be formed by making openings in an n$^-$-type semiconductor layer and by filling a p-type semiconductor layer into the openings. The film formation rate of the semiconductor layer at the upper part of the opening is faster than the film formation rate at the lower part of the opening. Therefore, a void is undesirably made if the upper part of the opening is plugged prior to the lower part of the opening being filled with the semiconductor layer. To reduce the likelihood of voids forming, it is desirable to set the width of the upper part of the opening to be wider than the width of the lower part of the opening.

However, in the case where the width of the upper part of the opening is set to be wider than the width of the lower part of the opening and the p-type semiconductor region is formed in the interior of the opening, the volume of the upper part of the p-type semiconductor region becomes larger than the volume of the lower part of the p-type semiconductor region. Therefore, in the case where the p-type impurity concentration of the p-type semiconductor region provided in the interior of the opening is uniform in the Z-direction, the p-type impurity amount of the upper part of the p-type semiconductor region undesirably is more than the p-type impurity amount of the lower part of the p-type semiconductor region.

Accordingly, to increase the breakdown voltage of the semiconductor device, it is desirable to set the p-type impurity concentration of the lower part of the p-type semiconductor region to be higher than the p-type impurity concentration of the upper part of the p-type semiconductor region.

Regarding this point, in the manufacturing method according to the embodiment, the p-type impurity is ion-implanted selectively into the lower part of the opening OP2 via the opening OP1; and subsequently, the opening OP2 is filled with the p⁻-type semiconductor layer 3a. By employing such a method, it is possible to form the p-type semiconductor region 3 in the lower part of the opening OP2 and form the p⁻-type semiconductor region 4a in the upper part of the opening OP2.

In other words, according to the manufacturing method according to the embodiment, even in the case where the width of the upper part of the opening OP2 is wider than the width of the lower part of the opening OP2, the p-type impurity concentration of the lower part of the p-type semiconductor region can be set to be higher than the p-type impurity concentration of the upper part of the p-type semiconductor region; and the difference can be reduced between the p-type impurity amount of the upper part of the p-type semiconductor region and the p-type impurity amount of the lower part of the p-type semiconductor region. As a result, it is possible to increase the breakdown voltage of the semiconductor device while reducing the likelihood of voids forming.

In the manufacturing method according to the embodiment, it is desirable to make the opening OP2 so that at least a part of the width of the portion where the second side surface S2 is formed is narrower than the width W1. By making the opening OP2 having such a structure, the ions are implanted also into at least a part of the second side surface S2 in addition to the bottom surface of the opening OP2 when ion-implanting the p-type impurity via the opening OP1. By ion-implanting the p-type impurity into the second side surface S2, compared to the case where the p-type impurity is ion-implanted into only the bottom surface, it is possible to reduce the difference between the p-type impurity amount of the upper part of the p-type semiconductor region and the p-type impurity amount of the lower part of the p-type semiconductor region.

If the dimension D1 is long, the volume of the upper part of the p⁻-type semiconductor layer 3a undesirably increases because the tilt of the first side surface S1 with respect to the n⁺-type semiconductor layer 8a is smaller than the tilt of the second side surface S2 with respect to the n⁺-type semiconductor layer 8a.

Therefore, in the manufacturing method according to the embodiment, it is desirable to make the opening OP2 so that the dimension D1 is shorter than the dimension D2. By setting the dimension D1 to be shorter than the dimension D2, compared to the case where the dimension D1 is longer than the dimension D2, the difference can be reduced between the p-type impurity amount of the upper part of the p-type semiconductor region and the p-type impurity amount of the lower part of the p-type semiconductor region.

The volume of the p-type semiconductor region formed on the first side surface S1 is larger than the volume of the p-type semiconductor region formed on the second side surface S2. Therefore, it is desirable for the width of the portion where the first side surface S1 is formed and a part of the width of the portion where the second side surface S2 is formed to be wider than the width W1 to reduce even further the difference between the p-type impurity amount of the upper part of the p-type semiconductor region and the p-type impurity amount of the lower part of the p-type semiconductor region. In other words, it is desirable to ion-implant the p-type impurity selectively in to the bottom portion of the opening OP2 and the lower part of the second side surface S2.

First Modification

In regard to the semiconductor device 100 shown in FIG. 1 and the method for manufacturing the semiconductor device shown in FIG. 2A to FIG. 4B, the case is described where the invention according to the embodiment is applied to a trench-gate type MOSFET in which the gate electrode 10 is provided in the interior of the opening OP3.

The invention according to the embodiment is not limited to a trench-gate type MOSFET and is applicable to a planar-gate type MOSFET in which the gate electrode is provided on the upper surface of the semiconductor layer.

An example of such a case will now be described using FIGS. 5A and 5B.

Figure 5A:
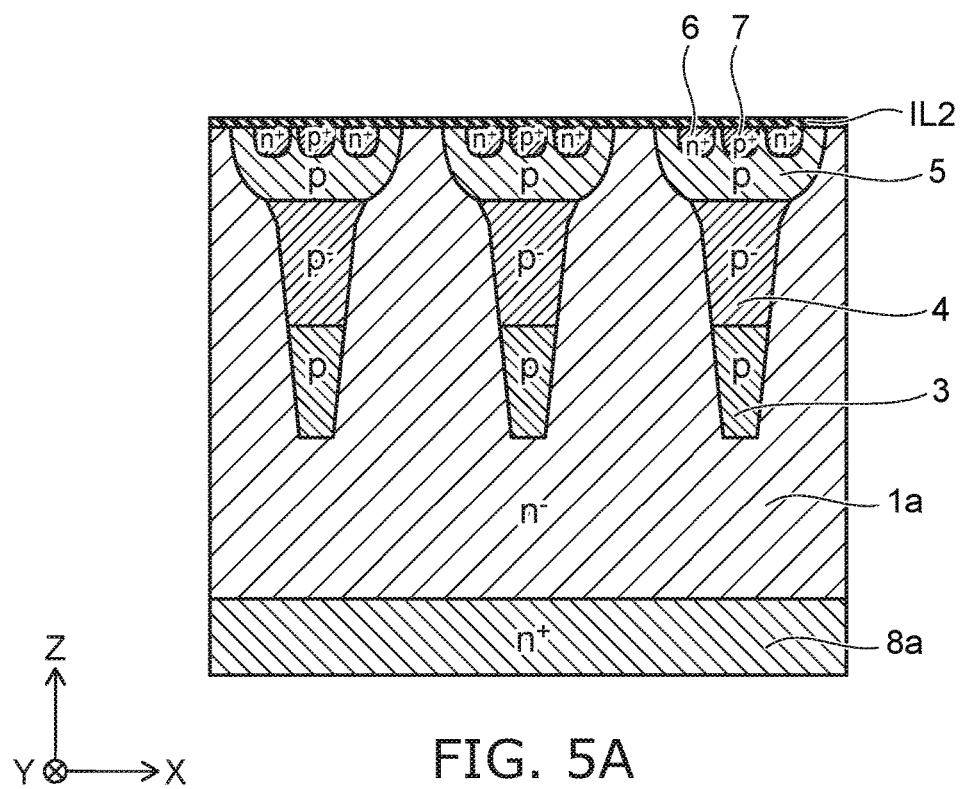
FIGS. 5A and 5B are cross-sectional views of processes, showing a method for manufacturing a semiconductor device according to the modification of the first embodiment.
Figure 5B:
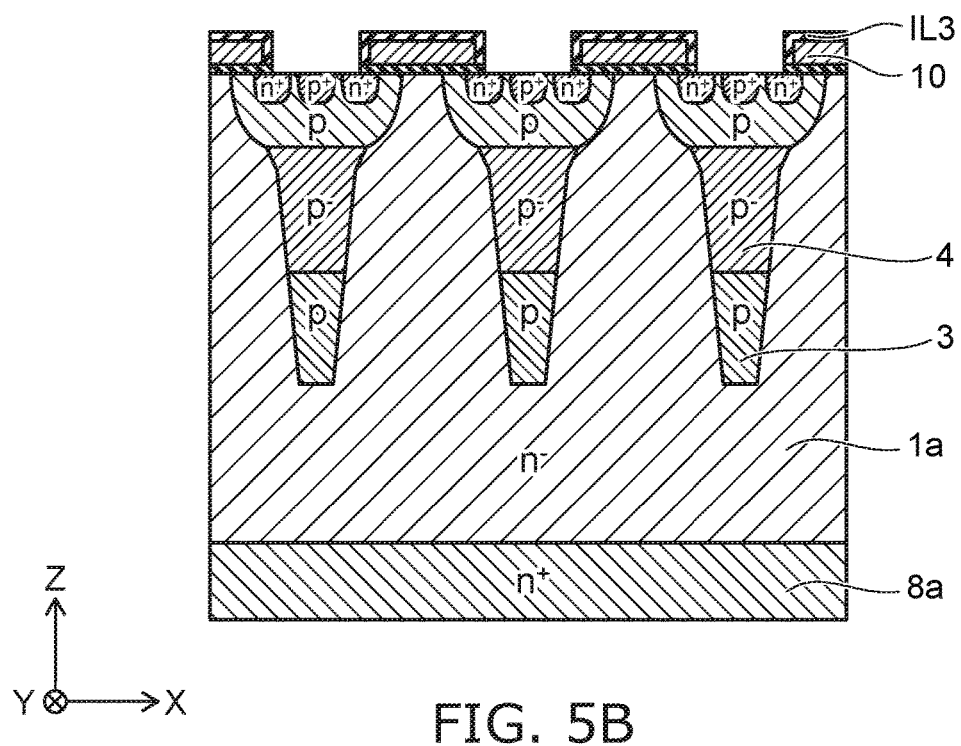

FIGS. 5A and 5B are cross-sectional views of processes, showing a method for manufacturing a semiconductor device according to the modification of the first embodiment.

First, the p-type semiconductor region 3 and the p⁻-type semiconductor region 4a are formed by performing processes similar to the processes shown in FIG. 2A to FIG. 3A. Then, a p-type impurity for forming the p-type base region 5 is ion-implanted into the front surface of the p⁻-type semiconductor region 4a. Continuing, an n-type impurity for forming a source region and a p-type impurity for forming a contact region are ion-implanted sequentially into the front surface of the region where the p-type impurity was ion-implanted. Continuing, by performing thermal oxidation, the ion-implanted impurities are activated and the insulating layer IL2 is formed on the n⁻-type semiconductor layer 1a and the p⁻-type semiconductor layer 3a. The state at this time is shown in FIG. 5A. The insulating layer IL2 is formed to cover the n⁻-type semiconductor layer 1a, the p-type base region 5, the n⁺-type source region 6, and the p⁺-type contact region 7.

Then, a conductive layer is formed on the insulating layer IL2; and the conductive layer is patterned. By this process, the gate electrode 10 that opposes, with the insulating layer IL2 interposed, the n⁻-type semiconductor layer 1a, the p-type base region 5, and the n⁺-type source region 6 is formed.

Then, the insulating layer IL3 that covers the gate electrode 10 is formed on the insulating layer IL2. Continuing, the n⁺-type source region 6 and the p⁺-type contact region 7 are exposed as shown in FIG. 5B by patterning the insulating layers IL2 and IL3. Thereafter, the planar-gate type semiconductor device is obtained by forming the source electrode 31 and the drain electrode 30 similarly to the process of FIG. 4B and subsequent processes.

By using the manufacturing method according to the embodiment in the manufacturing of the planar-gate type semiconductor device as well, it is possible to increase the breakdown voltage of the semiconductor device while reducing the likelihood of voids forming.

Second Embodiment

A method for manufacturing a semiconductor device according to a second embodiment will now be described using FIGS. 6A and 6B and FIGS. 7A and 7B.

FIGS. 6A and 6B and FIGS. 7A and 7B are cross-sectional views of processes, showing the method for manufacturing the semiconductor device according to the second embodiment.

Figure 6A:
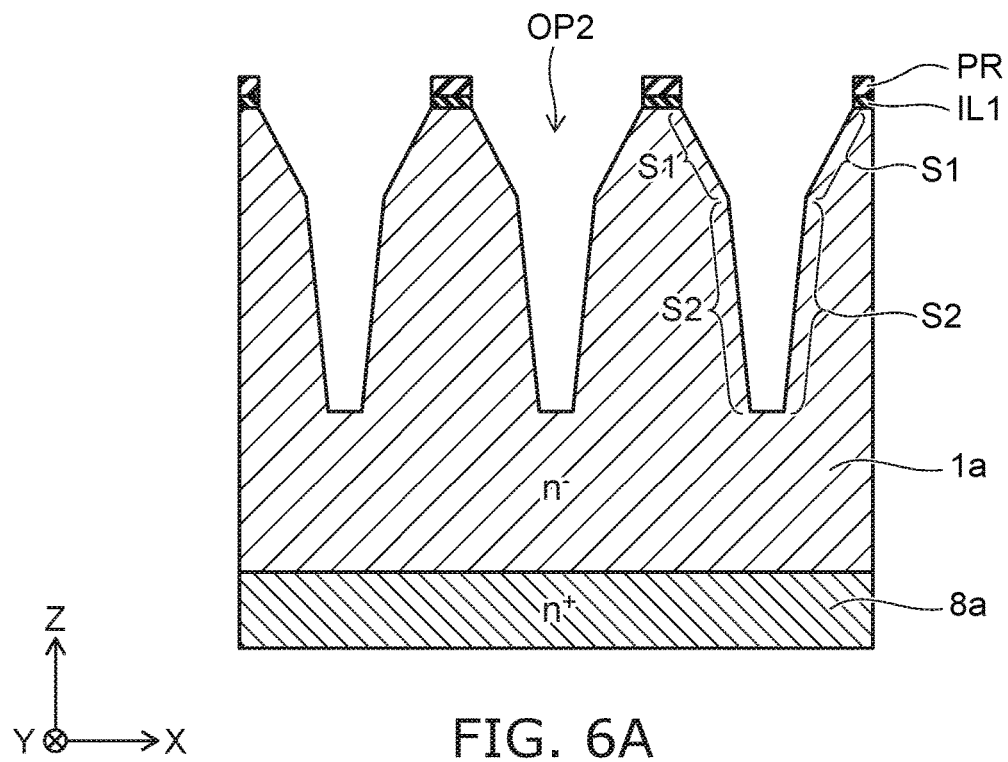
FIGS. 6A and 6B and FIGS. 7A and 7B are cross-sectional views of processes, showing the method for manufacturing the semiconductor device according to a second embodiment.

First, the opening OP2 is made in the n⁻-type semiconductor layer 1a by performing processes similar to the processes shown in FIG. 2A and FIG. 2B. Continuing, a part of the photoresist layer PR and a part of the insulating layer IL1 are etched selectively by wet etching. By this process, the portions of the photoresist layer PR and the insulating layer IL1 covering the opening OP2 are removed as shown in FIG. 6A.

Figure 6B:
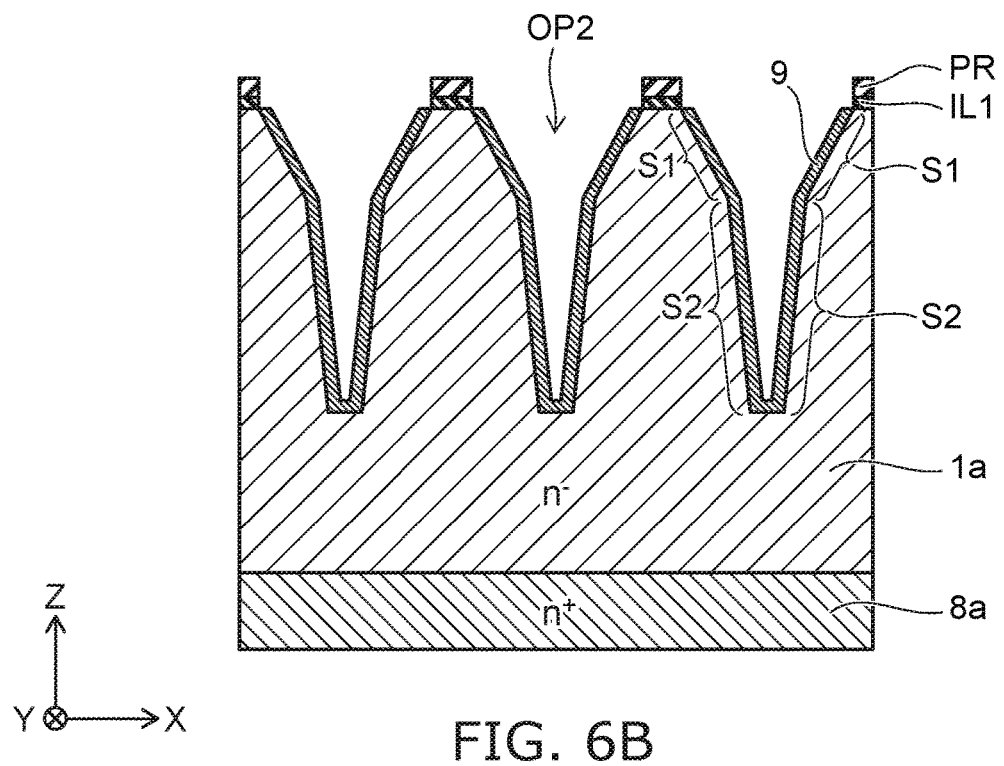

Then, a p-type impurity is deposited on the inner wall of the opening OP2 by generating plasma of a gas including the p-type impurity in a space where the n⁺-type semiconductor layer 8a and the n⁻-type semiconductor layer 1a are disposed. By this process, an impurity layer 9 that includes the p-type impurity is formed as shown in FIG. 6B.

Then, plasma of a noble gas is generated; and the noble gas ions are attracted by applying a voltage to the n⁺-type semiconductor layer 8a. At this time, the space where the processing is performed is set to a first pressure. The first pressure is lower than a second pressure described below.

In a space that has a low pressure, the mean free path of the ions is long; and the energy of the ions moving through the space is large. Therefore, the ions that are attracted toward the n⁺-type semiconductor layer 8a collide with the inner wall of the opening OP2 and perform sputtering of the impurity layer 9.

The sputtering rate when the ions collide is largest when the incident angle of the ions is near 45 degrees to 60 degrees and decreases as the incident angle approaches 0 degrees or 90 degrees. As described in the first embodiment, both the tilt of the first side surface S1 with respect to the n⁺-type semiconductor layer 8a and the tilt of the second side surface S2 with respect to the n⁺-type semiconductor layer 8a are 45 degrees or more; and the tilt of the second side surface S2 with respect to the n⁺-type semiconductor layer 8a is larger than the tilt of the first side surface S1 with respect to the n⁺-type semiconductor layer 8a. Therefore, the sputtering rate of the ions for the first side surface S1 is larger than the sputtering rate of the ions for the second side surface S2.

Figure 7A:
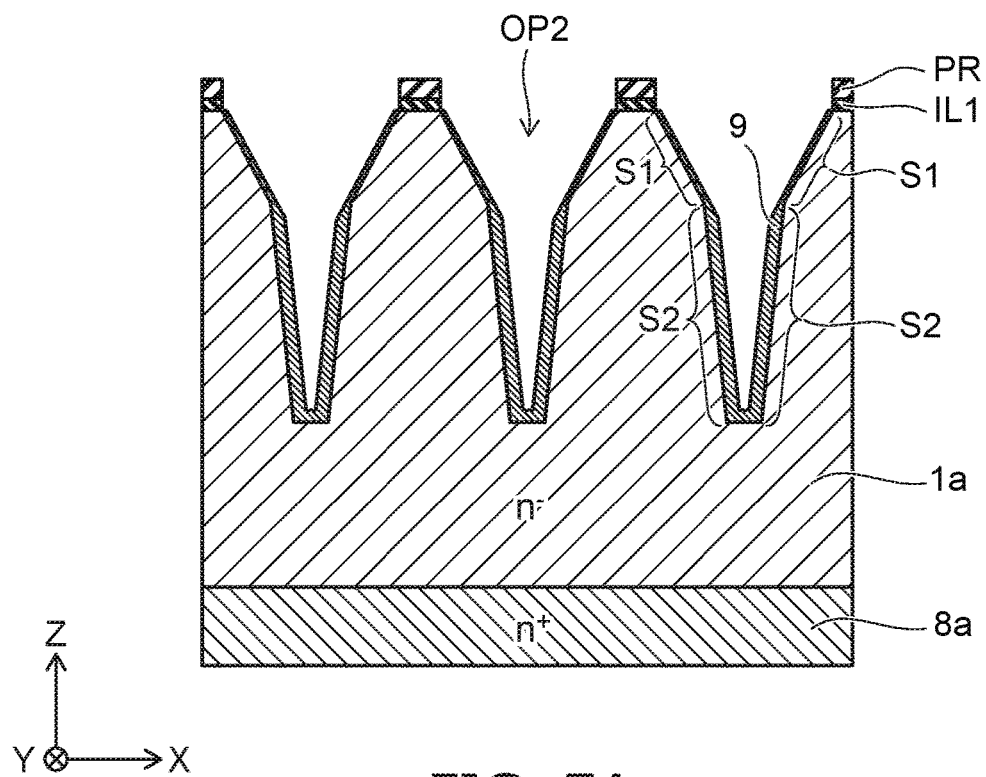

As a result, as shown in FIG. 7A, the film thickness of the impurity layer 9 formed on the first side surface S1 is thinner than the film thickness of the impurity layer 9 formed on the second side surface S2. Or, the impurity layer 9 that is formed on the first side surface S1 is removed.

Then, while still generating the plasma of the noble gas, the pressure of the space where the processing is performed is set to the second pressure that is higher than the first pressure; and the voltage that is applied to the n⁺-type semiconductor layer 8a is reduced.

The plasma of the noble gas may be allowed to disappear after performing the process shown in FIG. 7A and then generated again after setting the processing space to the second pressure. The application of the voltage to the n⁺-type semiconductor layer 8a may be stopped after the process shown in FIG. 7A is performed and then started again after generating the plasma of the noble gas.

In a space that has a high pressure, the mean free path of the ions is short; and the energy of the ions moving through the space is small. Therefore, even in the case where the ions collide with the side surface of the opening OP2, sputtering of the impurity layer 9 does not occur easily; and the impurity that is bombarded by the ions is pushed into the n⁻-type semiconductor layer 1a. In other words, the ion implantation into the n⁻-type semiconductor layer 1a surface is performed by the impurity being pushed into the n⁻-type semiconductor layer 1a surface.

Figure 7B:
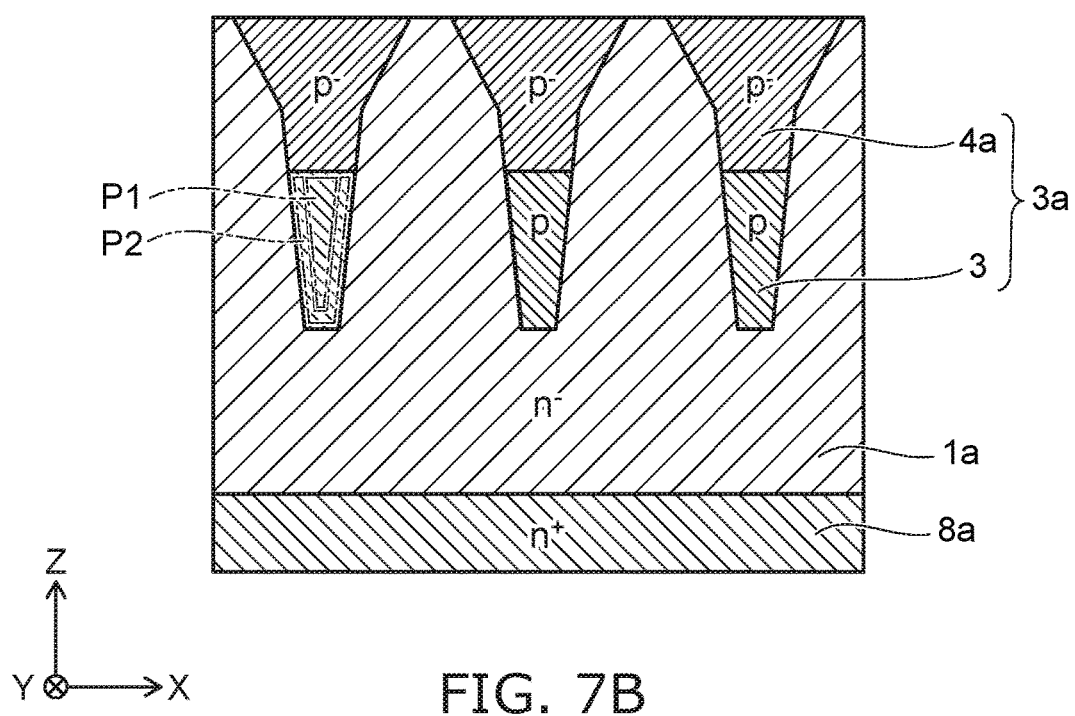

Then, the photoresist layer PR is removed; and the p⁻-type semiconductor layer 3a is formed to fill the opening OP2. Continuing, the upper surface of the p⁻-type semiconductor layer 3a is polished. Continuing, the insulating layer IL1 is removed; and the upper surface of the p⁻-type semiconductor layer 3a is planarized. Continuing, the p-type semiconductor region 3 and the p⁻-type semiconductor region 4a are formed as shown in FIG. 7B by performing heat treatment. At this time, similarly to FIG. 3A, the first portion P1 and the second portion P2 that has a higher p-type impurity concentration than the first portion P1 are formed in the p-type semiconductor region 3.

Subsequently, the semiconductor device is obtained by forming the gate electrode 10, the n⁺-type source region 6, the p⁺-type contact region 7, the source electrode 31, the drain electrode 30, etc., by performing processes similar to those of FIG. 4A and FIG. 4B.

In the manufacturing method according to the embodiment described above, for example, diborane ($B_2H_6$), boron trifluoride ($BF_3$), boron trichloride ($BCl_3$), boron tribromide ($BBr_3$), etc., may be used as the gas including the p-type impurity.

A gas that includes at least one of helium, neon, argon, krypton, or xenon may be used as the noble gas.

In the manufacturing method according to the embodiment, the ion implantation into the n⁻-type semiconductor layer 1a is performed by causing ions to collide with the impurity layer 9 after setting the film thickness of the impurity layer 9 formed on the first side surface S1 to be thinner than the film thickness of the impurity layer 9 formed on the second side surface S2.

According to the manufacturing method according to the embodiment, similarly to the manufacturing method according to the first embodiment, the p-type impurity concentration of the lower part of the p-type semiconductor region can be set to be higher than the p-type impurity concentration of the upper part of the p-type semiconductor region.

In other words, according to the manufacturing method according to the embodiment as well, it is possible to increase the breakdown voltage of the semiconductor device while reducing the likelihood of voids forming.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. One skilled in the art can appropriately select specific configurations of components included in the embodiments, for example the n⁻-type semiconductor region 1, the n⁻-type semiconductor layer 1a, the n⁻-type semiconductor region 2, the p-type semiconductor region 3, the p⁻-type semiconductor layer 3a, the p⁻-type semiconductor region 4, the p-type base region 5, the n⁺-type source region 6, the p⁺-type contact region 7, the n⁺-type drain region 8, the n⁺-type semiconductor layer 8a, the impurity layer 9, the gate electrode 10, the gate insulating layer 11, the drain electrode 30, the source electrode 31, the insulating layers IL1 to IL3, the photoresist layer PR, etc., from known art. The accompanying claims and their equivalents are intended to cover such forms or modifications as would fall within the scope and spirit of the invention.

What is claimed is:

1. A method for manufacturing a semiconductor device, comprising:
    forming a first opening in a second semiconductor layer of a first conductivity type, the second semiconductor layer being provided on a first semiconductor layer of the first conductivity type, the first opening extending in a second direction into the second semiconductor layer from an upper surface of the second semiconductor layer, a dimension in a third direction of the first opening at the upper surface being greater than a dimension in the third direction of a lower part of the first opening, the second direction being perpendicular to a first direction from the first semiconductor layer toward the second semiconductor layer, the third direction being perpendicular to the first direction and the second direction;
    ion-implanting an impurity of a second conductivity type into a side surface of the lower part of the first opening; and
    forming a third semiconductor layer of the second conductivity type in an interior of the first opening.

2. The method according to claim 1, further comprising forming a mask on the second semiconductor layer, the mask having a second opening extending in the second direction, the second opening having a first dimension in the third direction, the making of the first opening including using the mask to make the first opening, a dimension in the third direction of at least a part of the first opening at the upper surface being longer than the first dimension, and a dimension in the third direction of at least a part of the lower part being shorter than the first dimension,
    the ion-implanting including ion-implanting the impurity of the second conductivity type into the side surface of the lower part of the first opening via the second opening.

3. The method according to claim 2, wherein the making of the first opening includes making the first opening to have a first side surface and a second side surface, the first side surface being positioned higher than the second side surface, a tilt of the second side surface with respect to the first semiconductor layer being larger than a tilt of the first side surface with respect to the first semiconductor layer.

4. The method according to claim 3, wherein
    the making of the first opening includes a dimension in the third direction of at least a part of a portion where the second side surface is formed being shorter than the first dimension, and a dimension in the third direction of at least a part of a portion where the first side surface is formed being longer than the first dimension, and
    the ion-implanting of the impurity of the second conductivity type includes ion-implanting the impurity of the second conductivity type into a part of the second side surface of the first opening.

5. The method according to claim 3, wherein the making of the first opening includes a dimension in the first direction of the portion where the second side surface is formed being longer than a dimension in the first direction of the portion where the first side surface is formed.

6. The method according to claim 1, further comprising:
    forming a first semiconductor region of the second conductivity type in a surface of the second semiconductor layer and in a surface of the third semiconductor layer;
    making a third opening in the second semiconductor layer;
    forming a first insulating layer along an inner wall of the third opening;
    forming a gate electrode on the first insulating layer in an interior of the third opening; and
    forming a second semiconductor region of the first conductivity type selectively in a surface of the first semiconductor region.

7. The method according to claim 1, further comprising:
    forming a first insulating layer on the second semiconductor layer and on the third semiconductor layer;
    forming a first semiconductor region of the second conductivity type in a surface of the third semiconductor layer;
    forming a second semiconductor region of the first conductivity type selectively in a surface of the first semiconductor region; and
    forming a gate electrode on the first insulating layer, the gate electrode opposing the second semiconductor layer, the first semiconductor region, and the second semiconductor region.

8. The method according to claim 1, wherein the making of the first opening includes using a Chemical Dry Etching process and a Reactive Ion Etching process to make the first opening.

* * * * *